United States Patent
Kinyua

(10) Patent No.: US 9,425,815 B2
(45) Date of Patent: Aug. 23, 2016

(54) HYBRID PIPELINED ANALOG-TO-DIGITAL CONVERTER

(71) Applicant: TAIWAN SEMICONDUCTOR MANUFACTURING COMPANY, LTD., Hsinchu (TW)

(72) Inventor: Martin Kinyua, Cedar Park, TX (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/600,702

(22) Filed: Jan. 20, 2015

(65) Prior Publication Data

US 2016/0211858 A1    Jul. 21, 2016

(51) Int. Cl.
   - H03M 1/50     (2006.01)
   - H03M 1/46     (2006.01)
   - G04F 10/00    (2006.01)
   - H03M 1/14     (2006.01)

(52) U.S. Cl.
   CPC ............ *H03M 1/468* (2013.01); *G04F 10/005* (2013.01); *H03M 1/145* (2013.01)

(58) Field of Classification Search
   CPC .............................. H03M 1/468; G04F 10/005
   USPC ......................... 341/120, 155, 166, 156, 161
   See application file for complete search history.

(56) References Cited

U.S. PATENT DOCUMENTS

| | | | |
|---|---|---|---|
| 8,223,047 B2 | 7/2012 | Lai et al. | |
| 8,279,102 B2 | 10/2012 | Lai et al. | |
| 8,325,074 B2 | 12/2012 | Kinyua | |
| 8,471,751 B2 * | 6/2013 | Wang | H03M 1/145 327/307 |
| 8,476,971 B2 | 7/2013 | Peng et al. | |
| 8,493,259 B2 | 7/2013 | Lai et al. | |
| 8,547,259 B1 | 10/2013 | Huang et al. | |
| 8,599,057 B2 | 12/2013 | Lai et al. | |
| 8,629,795 B2 | 1/2014 | Peng et al. | |
| 8,760,329 B2 * | 6/2014 | Thiagarajan | H03M 1/125 341/118 |
| 8,830,106 B2 * | 9/2014 | Dasgupta | H03M 1/182 341/155 |
| 8,854,243 B2 * | 10/2014 | Yoshioka | H03M 1/38 341/155 |
| 8,872,686 B2 | 10/2014 | Chou et al. | |
| 2013/0009795 A1 | 1/2013 | Soenen et al. | |
| 2014/0159932 A1 | 6/2014 | Chang et al. | |

* cited by examiner

*Primary Examiner* — Brian Young
(74) *Attorney, Agent, or Firm* — Hauptman Ham, LLP

(57) ABSTRACT

An analog-to-digital converter (ADC) that comprises a first ADC stage and a second ADC stage. The first ADC stage comprises a successive approximation register (SAR). The first ADC is configured to convert an analog input signal into a first digital signal corresponding to a most-significant-bits (MSB) portion of a digital output signal. The first ADC stage is also configured to generate a residual voltage corresponding to a difference between a voltage value of the analog input signal and the first digital signal. The second ADC stage comprises a plurality of time-to-digital converter (TDC) cells coupled in series. The second ADC is configured to convert the residual voltage into a plurality of second digital signals generated by the TDC cells. The second digital signals correspond to a least-significant-bits (LSB) portion of the digital output signal. The digital output signal is a digital representation of the analog input signal.

20 Claims, 8 Drawing Sheets

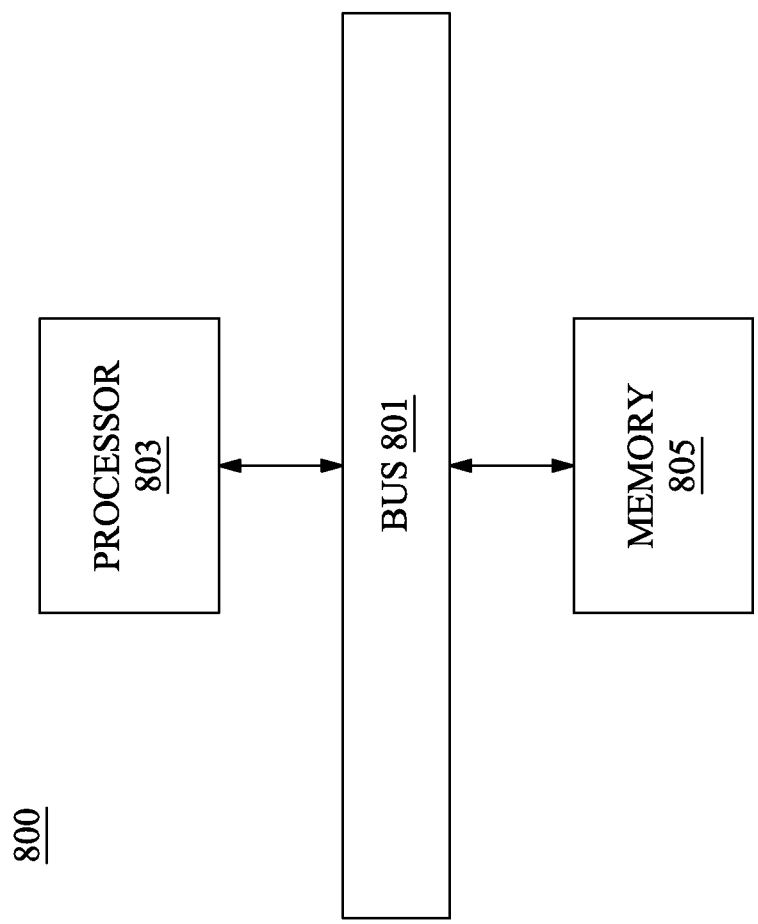

HYBRID PIPELINED ANALOG-TO-DIGITAL CONVERTER

BACKGROUND

Analog-to-digital converters (ADC) are used in a wide variety of applications, for example, in wireless communication, wireless sensor networks, portable diagnostic equipment, among others. Some ADC's are capable of achieving analog-to-digital signal conversions that output higher resolution digital signals than other ADC's. ADC's that output higher resolution digital signals consume larger amounts of power and/or larger amounts of device area compared to other ADC's that output lower resolution digital signals. ADC's that output higher resolution digital signals typically have slower processing speeds compared to other ADC's that output lower resolution digital signals.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8 is a functional block diagram of a computer or processor-based system upon which or by which at least one embodiment is implemented.

DETAILED DESCRIPTION

Figure 1:
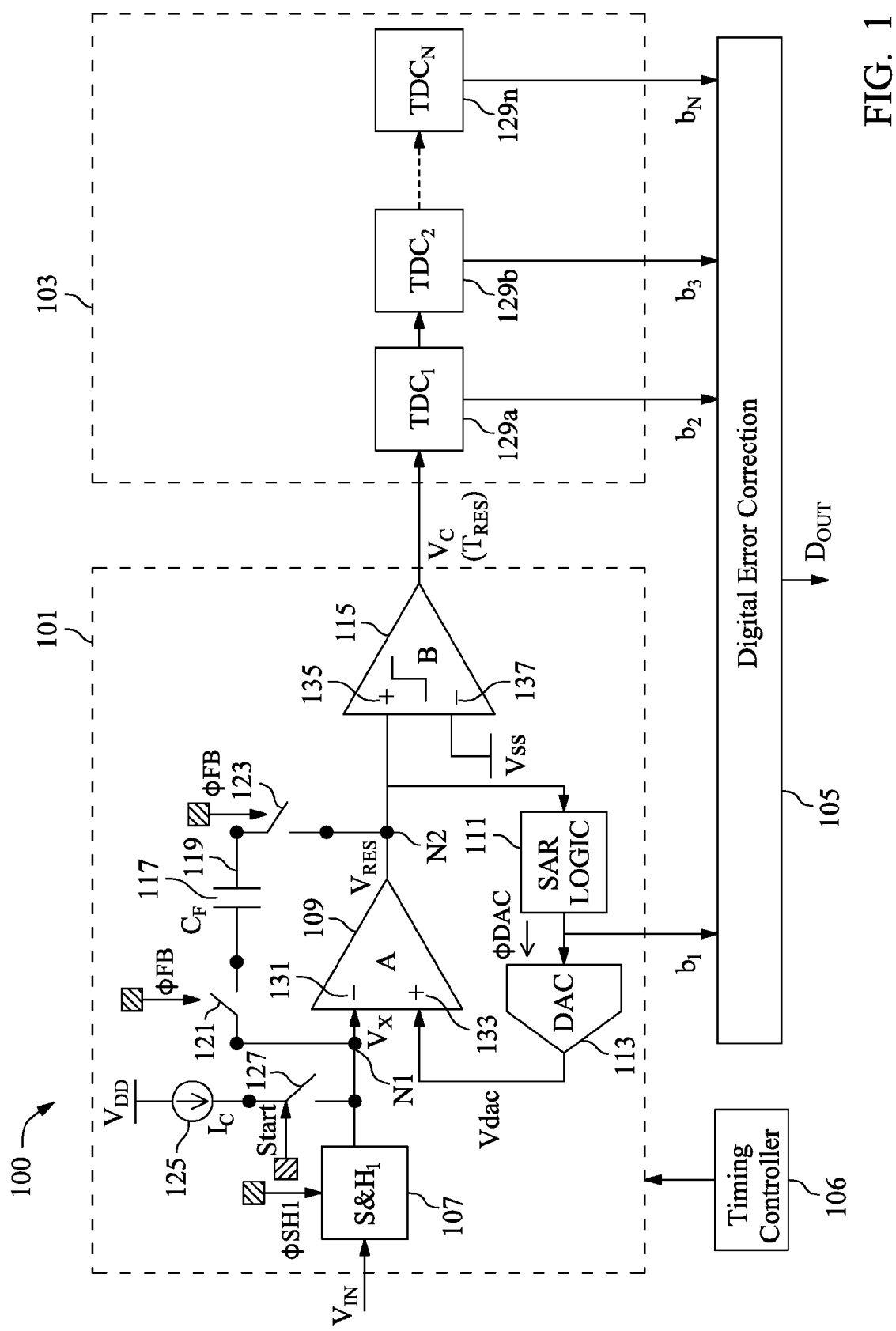
FIG. 1 is a schematic diagram of a hybrid pipelined ADC circuit, in accordance with one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

A hybrid, two-stage, analog-to-digital conversion (ADC) circuit that combines a voltage-domain based analog-to-digital conversion of an analog input signal in a first stage and a time-domain based analog-to-digital conversion of the analog input signal in a second stage is capable of balancing trade-offs associated with outputting a high resolution digital signal, power consumption, device area consumption, and processing speed. For example, some ADC's are capable of achieving analog-to-digital signal conversions that output higher resolution digital signals than other ADC's. ADC's that output higher resolution digital signals consume larger amounts of power and/or larger amounts of device area compared to other ADC's that output lower resolution digital signals. ADC's that output higher resolution digital signals typically have slower processing speeds compared to other ADC's that output lower resolution digital signals.

As semiconductor devices such as fin field effect transistor (FinFET) CMOS devices continue to shrink in physical size to meet market demands, these devices are manufactured using, for example, 10 nm FinFET processes or 7 nm FinFET processes.

FIG. 1 is a schematic diagram of a hybrid pipelined ADC circuit 100, in accordance with one or more embodiments. The ADC circuit 100 is readily scalable to be manufactured in compliance with sub-micron processes such as 10 nm FinFET processes or 7 nm FinFET processes.

ADC circuit 100 comprises a first ADC stage 101 and a second ADC stage 103 coupled with the first ADC stage 101. The first ADC stage 101 and the second ADC stage 103 are coupled with a digital error correction unit 105. The first ADC stage 101 is configured to perform an analog-to-digital conversion of an analog input signal $V_{IN}$ in a voltage domain, and the second ADC stage 103 is configured to perform a time-to-digital conversion of a signal Vc received from the first ADC stage 101. The digital error correction unit 105 is configured to generate a digital output signal $D_{OUT}$ representative of the analog input signal $V_{IN}$ in a digital format based on a first digital signal $b_1$ output by the first ADC stage 101 and one or more second digital signals $b_2$-$b_n$ output by the second ADC stage 103.

The first ADC stage 101 comprises a sample and hold circuit 107, a first comparator 109 coupled with the sample and hold circuit 107, a successive approximation register (SAR) 111 coupled with the first comparator 109 and the digital error correction unit 105, and a digital-to-analog converter (DAC) 113 coupled with the SAR 111 and the first comparator 109. The first ADC stage 101 also comprises a second comparator 115 coupled with the first comparator 109, a feedback capacitor 117 selectively coupled to a first node N1 between the sample and hold circuit 107 and the first comparator 109 and a second node N2 between the first comparator 109 and the second comparator 115 by way of a feedback path 119. The feedback path 119 comprises a first feedback switch 121 on a first node N1 side of the feedback capacitor 117 and a second feedback switch 123 on a second node N2 side of the feedback capacitor 117. The first feedback switch 121 is configured to selectively couple the first node N1 side of the feedback capacitor 117 with the first node N1, and the second feedback switch 123 is configured to selectively couple the second node N2 side of the feedback capacitor 117 with the second node N2. The first ADC stage 101 further comprises a first current source 125 that is selectively coupled with the first node N1 by a first current source switch 127. First current source 125 is coupled with a voltage supply $V_{DD}$. ADC 100 further comprises a timing controller 106 configured to control the temporal sequence of operations for the first ADC stage 101.

The second ADC stage 103 comprises a plurality of pipelined time-to-digital converter (TDC) cells 129a-129n coupled in series. A first TDC cell 129a is coupled with the second comparator 115. The TDC cells 129a-129n are coupled with the digital error correction unit 105.

The first ADC stage 101 is configured to convert an analog input signal $V_{IN}$ into the first digital signal $b_1$. The first digital signal $b_1$ corresponds to a most-significant-bits (MSB) portion of the digital output signal $D_{OUT}$. The first ADC stage 101 is also configured to generate a residual voltage $V_{RES}$. The residual voltage $V_{RES}$ corresponds to a difference in voltage value between the analog input signal $V_{IN}$ and the first digital signal $b_1$. The first ADC stage 101 converts the residual voltage $V_{RES}$ from a voltage domain representation to a time domain representation $T_{RES}$ for processing by the second ADC stage 103. The control signal $V_C$ comprises the time domain representation of the residual voltage $T_{RES}$.

In operation, SAR 111 controls the DAC 113 based on an operating mode of the ADC 100. For example, SAR 111 controls the DAC 113, based on whether the ADC 100 is in a sample and hold mode, or a redistribution mode. Timing controller 106 controls the sample and hold circuit 107, the first feedback switch 121, the second feedback switch 123 and the first current switch 127 based on an operating mode of the ADC 100. For example, the timing controller 106 controls the sample and hold circuit 107, the first feedback switch 121, the second feedback switch 123 and the first current switch 127 based on whether the ADC 100 is in a sample and hold mode, or a redistribution mode.

The SAR 111 comprises switch control logic that, when executed by a processor, causes one or more control signals to be at a logic high or a logic low, which causes various switches in the DAC 113 to be selectively opened or closed based on the operating mode of the ADC circuit 100. For example, the DAC 113 is controlled by DAC control signal $\phi_{DAC}$. Similarly, the timing controller 106 comprises control logic that, when executed by a processor, causes one or more control signals to be at a logic high or a logic low which causes various devices to be actuated or switches to be selectively opened or closed based on the operating mode of the ADC circuit 100. For example, the sample and hold circuit 107 is controlled by sample and hold signal $\phi_{SH1}$, the first feedback switch 121 and the second feedback switch 123 are controlled by feedback control signal $\phi_{FB}$, and the first current switch 127 is controlled by a start signal. The timing controller 106 is coupled with the sample and hold circuit 107, the first feedback switch 121, the second feedback switch 123 and the first current switch 127 to provide the various control signals. The couplings between the timing controller 106 with the sample and hold circuit 107, the DAC 113, the first feedback switch 121, the second feedback switch 123 and the first current switch 127 are illustrated by way of boxes drawn similarly to the timing controller 106 to avoid obscuring the drawing. The control signals provided by the timing controller 106 synchronize the operations of the SAR 111 with the with the sample and hold circuit 107, the first feedback switch 121, the second feedback switch 123 and the first current switch 127. Though discussed herein as switches, one or more of first feedback switch 121, second feedback switch 123, first current switch 127, another suitable switch is optionally replaced with a transistor that is configured to be turned on or off to couple various features of the discussed embodiments.

First comparator 109 comprises a first input 131 coupled with the first node N1 and a second input 133 coupled with the DAC 113. The first comparator 109 is configured to compare a voltage $V_X$ at first node N1 with a voltage $V_{dac}$ of an output of the digital-to-analog converter 113. In some embodiments, the second input 133 of the first comparator 109 is coupled with a ground voltage $V_{SS}$ or another voltage signal used as a reference voltage signal. The SAR 111 is configured to receive an output of the first comparator 109. The output of the first comparator 109 is a digital representation of the analog input signal $V_{IN}$, which is converted into the first digital signal $b_1$ by the SAR 111. The first digital signal $b_1$ comprises the residual voltage $V_{RES}$. The DAC 113 converts the first digital signal $b_1$ from digital form to analog form for the first comparator 109 to compare the voltage value $V_{dac}$ of the first digital signal $b_1$ in the analog form to the voltage $V_X$ at first node N1. The first comparator 109 generates the residual voltage $V_{RES}$, based on the comparison of Vdac with $V_X$.

The voltage of input signal $V_{IN}$ is either equal to $V_X$ or different from $V_X$. If the ADC 100 is in the sample and hold operating mode or a redistribution operating mode, then $V_{IN}$ equals $V_X$. If the ADC 100 is in a voltage-to-time conversion (VTC) operating mode, then $V_{IN}$ is different from $V_X$. Sample and hold circuit 107 comprises a capacitor array that includes a plurality of capacitors that are selectively coupled with the input signal $V_{IN}$ or a reference signal (discussed below) based on the operating mode of the ADC 100. The sample and hold circuit 107, accordingly, has different operating configurations that correspond to the various operating modes of the ADC 100. As such, the operating configuration of the sample and hold circuit 107 dictates whether $V_{IN}$ equals $V_X$.

The feedback capacitor 117 is configured to store the residual voltage $V_{RES}$. Timing controller 106 is configured to cause first feedback switch 121 and second feedback switch 123 to couple the feedback capacitor 117 with the first node N1 and the second node N2 by way of feedback signal $\phi_{FB}$. In some embodiments, if the timing controller 106 causes the feedback signal $\phi_{FB}$ to be at a logic high, then timing controller 106 causes first feedback switch 121 and second feedback switch 123 to couple the feedback capacitor 117 with the first node N1 and the second node N2. In some embodiments, feedback signal $\phi_{FB}$ turns a transistor on or off.

Timing controller 106 is configured to provide the Start signal at a time when the feedback capacitor 117 is coupled with the first node N1 and the second node N2, activating the first current source 125. In some embodiments, the timing controller 106 causes the Start signal to be at a logic high at a time when the feedback capacitor 117 is coupled with the first node N1 and the second node N2, activating the first current source 125. In some embodiments, the first current source 125 is turned on or off by the Start signal. In some embodiments, the Start signal causes switch 127 to couple the first current source 125 with the first node N1, activating the first current source 125.

Activating the first current source 125 during a period which the feedback capacitor 117 is coupled with first node N1 and second node N2 causes the residual voltage $V_{RES}$ to be drained from the feedback capacitor 117 at a near constant rate. The residual voltage $V_{RES}$ is converted from a voltage domain representation to a time domain representation $T_{RES}$ based on an amount of time that the residual voltage $V_{RES}$ takes to drain from the feedback capacitor 117. In some embodiments, activation of the first current source 125 amplifies the residual voltage $V_{RES}$. In some embodiments, first current source is configured to supply a fixed current that has a value from about 100 microamps ($\mu$A) to about 1 milliamp (mA). In some embodiments, the first current source 125 is configured to supply an adjustable current that ranges from about 100 $\mu$A to about 1 mA.

Second comparator 115 comprises a third input 135 coupled with the first comparator 109 and a fourth input 137 coupled with a ground voltage $V_{SS}$. The second comparator 115 is configured to compare the residual voltage $V_{RES}$ with the ground voltage $V_{SS}$ and to output the control signal $V_C$ to the second ADC stage 103. In some embodiments, the control signal $V_C$ stops the second ADC stage 103 from converting the residual voltage $V_{RES}$ into the plurality of second digital signals b2-bn. In some embodiments, if the second comparator 115 determines the residual voltage $V_{RES}$ is equal to the ground voltage $V_{SS}$, then the control signal $V_C$ generated by the second comparator 115 causes the second ADC stage 103 to stop the conversion of the residual voltage $V_{RES}$ into the plurality of second digital signals b2-bn. Alternatively, if the residual voltage $V_{RES}$ is within a predetermined threshold from the ground voltage $V_{SS}$, then the control signal $V_C$ generated by the second comparator 115 stops the conversion of the residual voltage $V_{RES}$ into the plurality of second digital signals b2-bn. In some embodiments, control signal $V_C$ is the time domain representation of the residual voltage $T_{RES}$.

The second ADC stage 103 is configured to convert the time domain representation of the residual voltage $T_{RES}$ into the plurality of second digital signals $b_2$-$b_n$. Each of the plurality of second digital signals $b_2$-$b_n$ is generated by a corresponding TDC cell 129a-129n. The second digital signals $b_2$-$b_n$ collectively correspond to a least-significant-bits (LSB) portion of the digital output signal $D_{OUT}$. In some embodiments, the first digital signal $b_1$ is a coarse conversion of the analog input signal $V_{IN}$ to a digital format, and the second digital signals $b_2$-$b_n$ are sequentially refined conversions of the residual voltage $V_{RES}$ in the digital domain, having been generated based on the time domain representation of the residual voltage $T_{RES}$.

The residual voltage in the time domain $T_{RES}$ is converted to a second digital signal $b_2$ by a first TDC cell 129a. The second digital signal $b_2$ is processed by a subsequent TDC cell 129b, which outputs another second digital signal $b_3$ based on the second digital signal $b_2$.

The second digital signal $b_2$ comprises a quantization error charge related to a remaining portion of the residual voltage in the time domain $T_{RES}$. This quantization charge is converted from the digital domain to the time domain by the TDC cells 129a-129n and is communicated to a next TDC cell 129b-129n. As such, each successive TDC cell 129b-129n that follows TDC cell 129a generates a respective second digital signal $b_3$-$b_n$ based on a prior second digital signal $b_2$-$b_{n-1}$ output by the previous TDC cell 129a-129n-1. In some embodiments, a quantity of TDC cells 129a-129n corresponds to an N-bit resolution of the digital output signal $D_{OUT}$. In some embodiments, the resolution of the ADC circuit 100 increases with each additional the TDC cell 129a-129n that is included in the second ADC stage 103.

The first digital signal $b_1$ and the second digital signals $b_2$-$b_n$ are processed by the digital error correction unit 105 to generate the digital output signal $D_{OUT}$. The digital output signal $D_{OUT}$ generated by the digital error correction unit 105 is a digital representation of the analog input signal $V_{IN}$. In some embodiments, the digital error correction unit 105 combines the first digital signal $b_1$ and the second digital signals $b_2$-$b_n$. In some embodiments, the digital error correction unit 105 performs one or more levels of processing on the first digital signal $b_1$ and/or the second digital signals $b_2$-$b_n$ before the first digital signal $b_1$ and the second digital signals $b_2$-$b_n$ are combined. In some embodiments, the digital error correction unit 105 performs an overlapped addition of the digital inputs $b_1$ and $b_2$-$b_n$, or other suitable form of digital error correction on the first digital signal $b_1$ and/or the second digital signals $b_2$-$b_n$.

Figure 2:
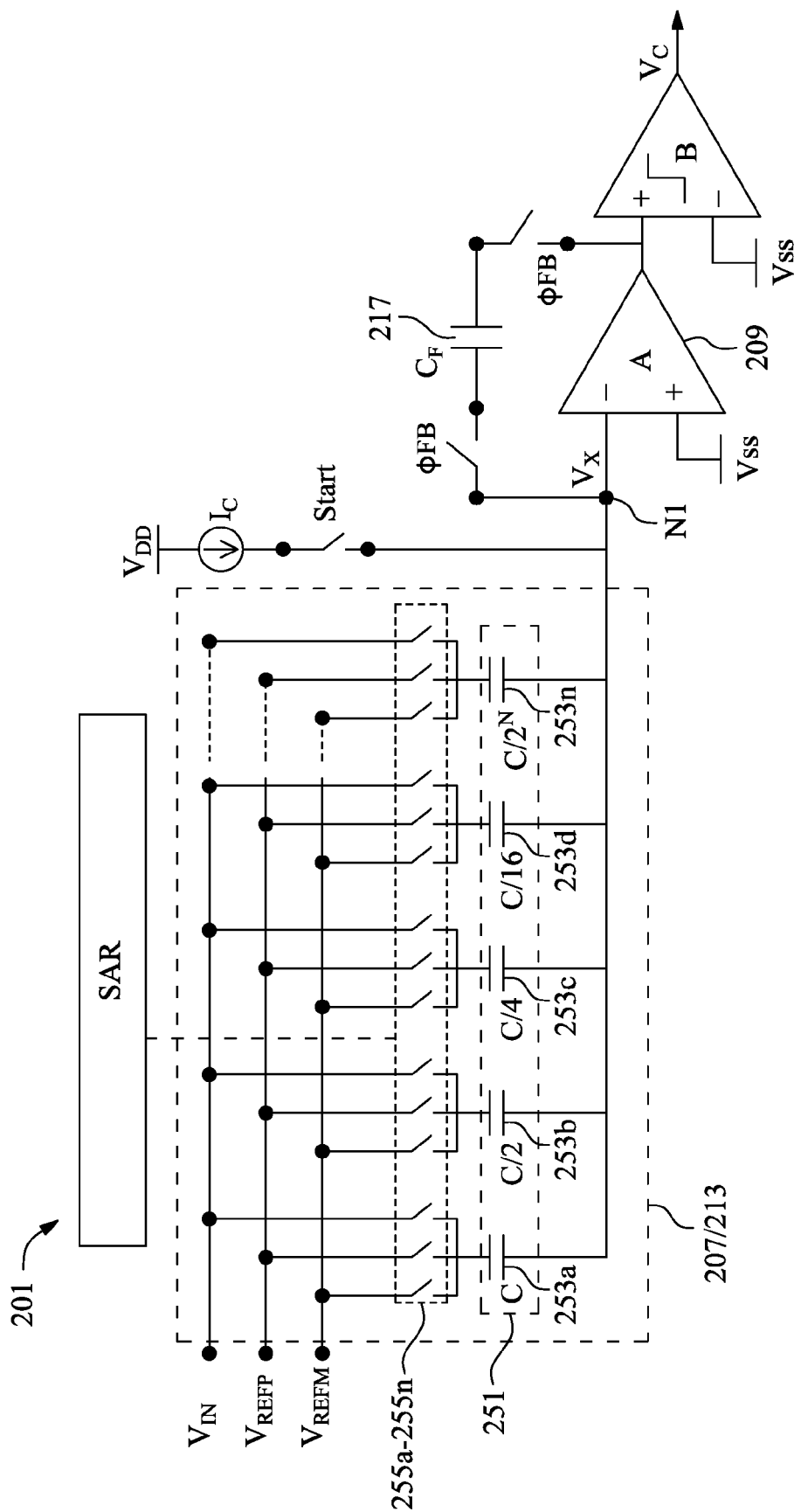
FIG. 2 is a schematic diagram of a first ADC stage, in accordance with one or more embodiments.

FIG. 2 is a schematic diagram of a first ADC stage 201, in accordance with one or more embodiments. First ADC stage 201 is similar to the first ADC stage 101 (FIG. 1) and comprises similar features with the reference numerals increased by 100. In this example embodiment, the first ADC stage 201 includes a combination sample and hold circuit 207/DAC 213 that comprises a first capacitor array 251. First capacitor array 251 includes a plurality of capacitors 253a-253n. The capacitors 253a-253n of the first capacitor array 251 comprise a first side coupled with the first node N1 and a second side configured to be selectively coupled with one of the analog input signal $V_{IN}$, a first reference signal $V_{REFP}$ or a second reference signal $V_{REFM}$. In some embodiments, second reference signal $V_{REFM}$ is equal to the ground voltage $V_{SS}$.

The capacitors 253a-253n are selectively coupled with the analog input signal $V_{IN}$, the first reference signal $V_{REFP}$ or the second reference signal $V_{REFM}$ by switches 255a-255n. Switches 255a-255n are coupled with the SAR 111 and are controlled by SAR 111 in accordance with the sample and hold signal $\phi_{SH1}$ (FIG. 1) provided by timing controller 106 (FIG. 1). SAR 111 controls the selective coupling of the capacitors 253a-253n with the analog input signal $V_{IN}$, the first reference signal $V_{REFP}$ or the second reference signal $V_{REFM}$ based on the residual voltage $V_{RES}$ output by the first comparator 209. In some embodiments, the SAR 111 controls the selective coupling of the capacitors 253a-253n with the analog input signal $V_{IN}$, the first reference signal $V_{REFP}$ or the second reference signal $V_{REFM}$ based on a polarity bit of the residual voltage $V_{RES}$ output by the first comparator 209. As $V_X$ varies from $V_{IN}$, because of the residual voltage $V_{RES}$, the SAR 111 alters the coupling configuration of the capacitors 253a-253n to help minimize the residual voltage $V_{RES}$. The selective coupling of the second sides of the capacitors 253a-253n of the first capacitor array 251 redistributes one or more charges accumulated in the capacitors 253a-253n, if the ADC 100 is in the redistribution mode during the analog-to-digital conversion. After the conversion, the SAR 111 generates the first digital signal $b_1$ based on the statuses of the switches 255a-255n.

The capacitors 253a-253n of the capacitor array 251 are weighted with respect to one another. For example, the capacitor 253a has a capacitance of C, the capacitor 253b has a capacitance of C/2, the capacitor 253c has a capacitance of C/4, the capacitor 253d has a capacitance of C/16, and the capacitor 253n has a capacitance of $C/2^N$. Alternatively, the capacitors 253a-253n, in some embodiments, have equal capacitances. In some embodiments, the capacitance C is from about 1 picofarads (pF) to about 5 pF. The feedback capacitor 217 as a capacitance $C_F$ that is from about 1 pF to about 5 pF. In some embodiments, $C_F$ is equal to C. In other embodiments, $C_F$ is different from C.

In some embodiments, the quantity of capacitors 253a-253n in the capacitor array 251 corresponds to the resolution of the first ADC stage 201. For example, a capacitor array 251 having N capacitors is configured to support an N-bit digital output signal $D_{OUT}$.

Figure 3:
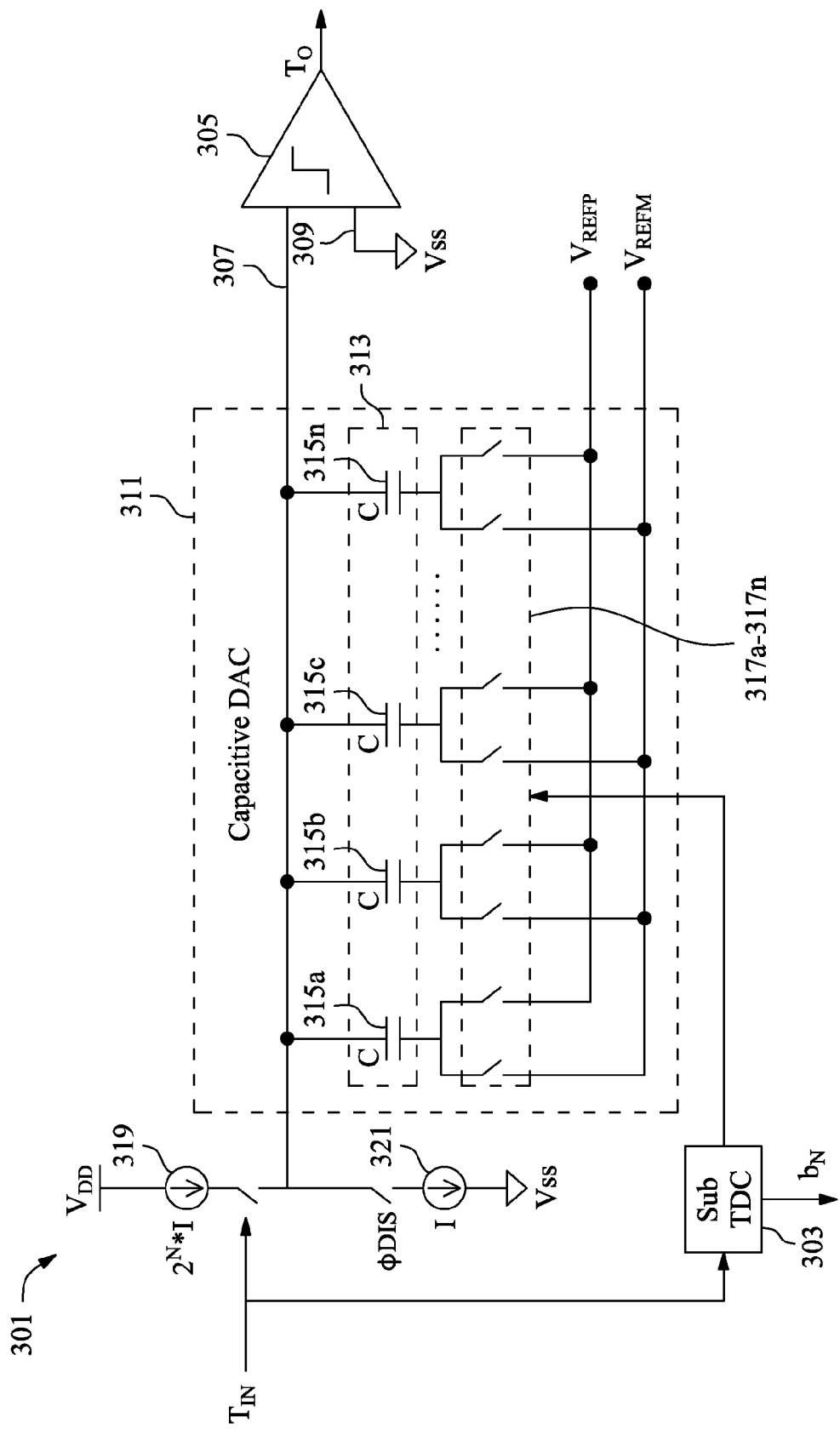
FIG. 3 is a schematic diagram of a time-to-digital converter (TDC) cell, in accordance with one or more embodiments.

FIG. 3 is a schematic diagram of a TDC cell 301, in accordance with one or more embodiments. TDC cell 301 corresponds to one or more of the TDC cells 129a-129n (FIG. 1). TDC cell 301 comprises a sub-TDC 303. The sub-TDC 303 is configured to receive the residual voltage $V_{RES}$ in the time domain $T_{RES}$ as a signal $T_{IN}$. In some embodiments, $T_{IN}$ corresponds to control signal $V_C$ (FIG. 1). If TDC cell 301 corresponds to TDC cell 129a, then the signal $T_{IN}$ corresponds to the residual voltage in the time domain $T_{RES}$, that is the signal $T_{IN}$ that is output by the first ADC stage 101 (FIG. 1). If the TDC cell 301 corresponds to one of TDC cell 129b-129n, then the signal $T_{IN}$ corresponds to a time domain representation of one of the second digital signals $b_2$-$b_{n-1}$ output from a previous TDC cell 129a-129n-1. TDC cell 301 also comprises third comparator 305 having a fifth input 307 and a sixth input 309 coupled with the ground voltage $V_{SS}$.

TDC cell 301 further comprises a capacitive DAC 311 having a second capacitor array 313. The second capacitor array 313 comprises a plurality of capacitors 315a-315n. A first side of the capacitors 315a-315n are coupled with the fifth input 307 of the third comparator 305 and a second side of the capacitor 315a-315n are configured to be selectively coupled with the first reference signal $V_{REFP}$ or the second reference signal $V_{REFM}$. The second sides of the capacitors 315a-315n are selectively coupled with the first reference signal $V_{REFP}$ or the second reference signal $V_{REFM}$ by switches 317a-317n.

TDC cell 301 additionally comprises a second current supply 319 configured to be selectively coupled with the first sides of the capacitors 315a-315n in a charge mode. The charge mode is indicated by the received signal $T_{IN}$. In other words, TDC cell 301 is in the charge mode during a period that the signal $T_{IN}$ is received. TDC cell 301 also comprises a third current supply 321 configured to be selectively coupled with the first sides 313a-313n of the capacitors 315a-315n in a discharge mode. The discharge mode is indicated by a signal $\phi_{DIS}$ received from the timing controller 106 (FIG. 1). The second current supply 319 is greater than the third current supply 321. In some embodiments, the second current supply 319 supplies a current that is two or more times greater than the current supplied by third current supply 321. In some embodiments, if the third current supply 321 is configured to supply a current of I amps, the second current supply 319 supplies a current equal to $2^N*I$ amps, where N is the quantity of capacitors 315a-315n that corresponds to the N-bit resolution of the second digital signals $b_2$-$b_n$.

The sub-TDC 303 is configured to generate a code based on the signal $T_{IN}$. The code based on the signal $T_{IN}$ is a digital code based upon which of the second sides of the capacitors 315a-315n are selectively coupled with the first reference signal $V_{REFP}$ or the second reference signal $V_{REFM}$. In some embodiments, the code generated by sub-TDC 303 corresponds to one of the second digital signals $b_2$-$b_n$. The capacitive DAC 311 converts the generated second digital signal $b_2$-$b_n$ back to a time domain that is output from the TDC cell 301 as signal $T_O$. TDC cells 129a-129n are pipelined such that each output signal $T_O$ that is generated by a previous TDC cell 129a-129n-1 is a sequentially refined conversion of the time domain representation of the residual voltage $T_{RES}$ that remains after a previous time-to-digital conversion performed by a previous TDC cell 129a-129n-1.

A charge time of the capacitors 315a-315n differs from a discharge time of the capacitors 315a-315n. The third comparator 305 amplifies the residual voltage $V_{RES}$ in the time domain $T_{RES}$ based on a difference between the charge time and the discharge time of the capacitors 315a-315n and outputs a time domain representation $T_{RES}$ of the residual voltage $V_{RES}$ as signal $T_O$. A next TDC cell 129b-129n receives the signal $T_O$ for further processing and/or refinement.

Figure 4:
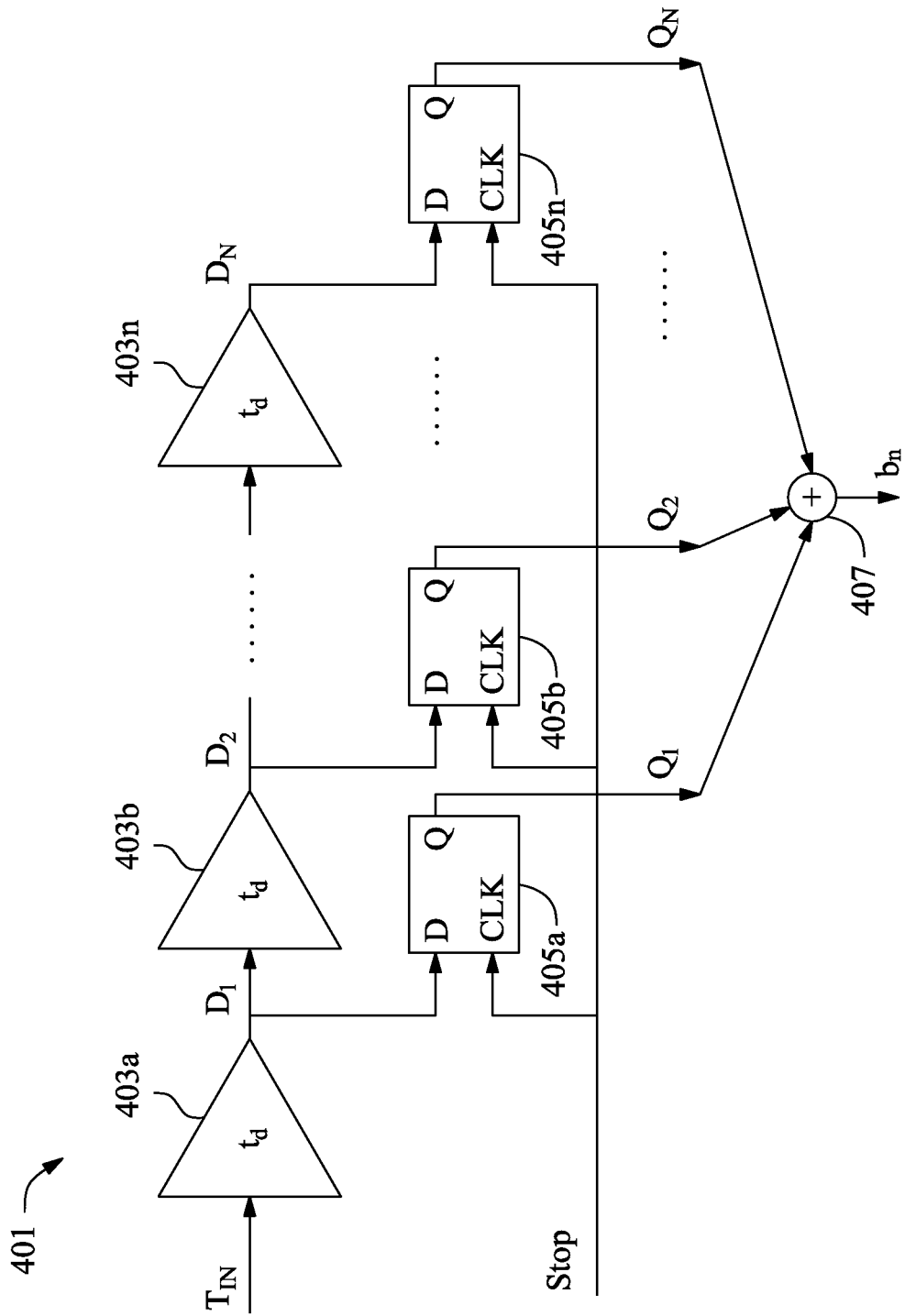
FIG. 4 is a schematic diagram of a sub-TDC, in accordance with one or more embodiments.

FIG. 4 is a schematic diagram of a sub-TDC 401, in accordance with one or more embodiments. Sub-TDC 401 corresponds to sub-TDC 303 (FIG. 3). Sub-TDC 401 comprises one or more delay elements 403a-403n, coupled with one or more latches 405a-405n, and a summer 407. A first delay element 403a is configured to receive the signal $T_{IN}$ from the first ADC stage 101 or a previous TDC cell 129a-129n-1. For example, if the timing controller 106 (FIG. 1) causes the Start signal (FIG. 1) to be at a logic high, then the sub-TDC 401 converts the signal $T_{IN}$ from the time domain to the digital domain. Alternatively, the timing controller 106 provides the Start signal as an instruction to cause the sub-TDC 401 to convert the signal $T_{IN}$ from the time domain to the digital domain. During the time-to-digital conversion, each delay element 403a-403n delays propagation of the signal $T_{IN}$ by a time segment $T_d$. For each time segment $T_d$, a corresponding one of the latches 405a-405n is configured to be triggered. At the end of the digital-to-analog conversion, the first ADC stage 101 (FIG. 1) generates the control signal $V_C$ (FIG. 1) that causes the sub-TDC 401 to stop the time-to-digital conversion of the signal $T_{IN}$. In some embodiments, the control signal $V_C$ is a Stop signal. The Stop signal latches the output of latches 405a-405n. The outputs of the latches 405a-405n are added by the summer 407, which generates one of the second digital signals $b_2$-$b_n$. In some embodiments, a quantity of delay elements 403a-403n and/or latches 405a-405n corresponds to the resolution of the ADC circuit 100 (FIG. 1).

Figure 5:
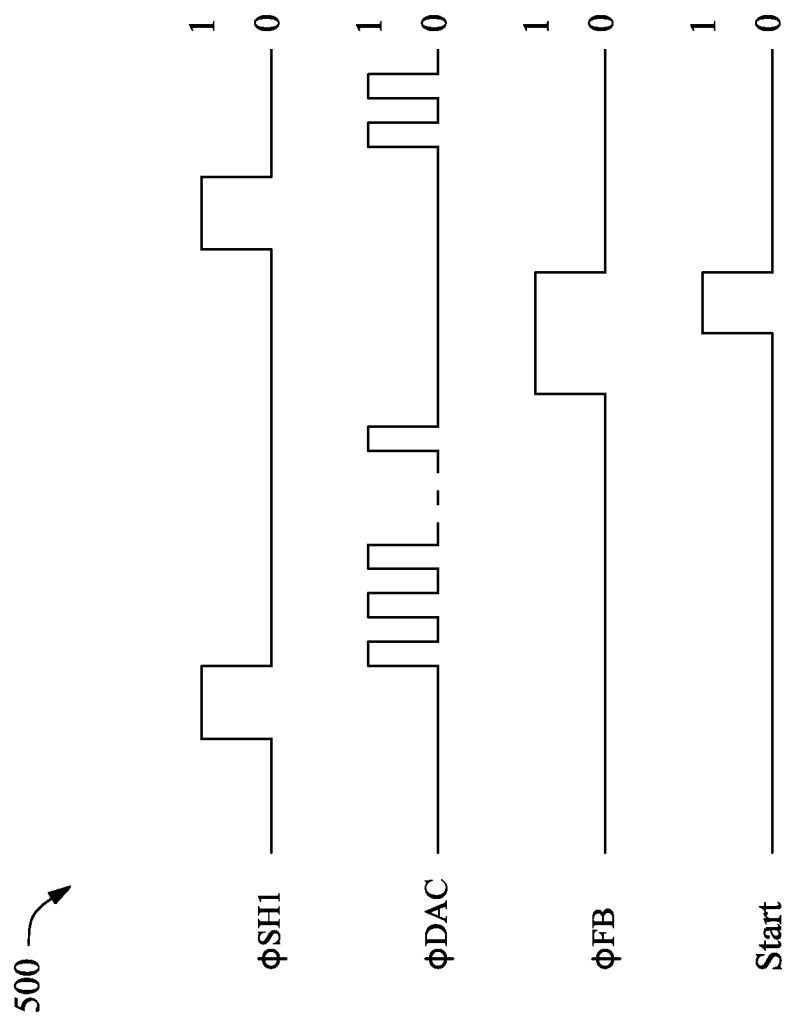
FIG. 5 is a timing diagram of control signals for use in an ADC, in accordance with one or more embodiments.

FIG. 5 is a timing diagram 500 of the control signals output by SAR 111 and timing controller 106 (FIG. 1), in accordance with one or more embodiments.

Timing controller 106 activates the sample and hold circuit 107 (FIG. 1) by causing the sample and hold signal $\phi_{SH1}$ to be at a logic high [1] in the sample mode. The DAC control signal $\phi_{DAC}$, feedback control signal $\phi_{FB}$, and the Start signal are all at a logic low [0] while the sample and hold signal $\phi_{SH1}$ is at the logic high [1]. SAR 111 activates DAC 113 (FIG. 1) by causing DAC control signal $\phi_{DAC}$ to be at a logic high [1] in the hold mode, while the sample and hold signal $\phi_{SH1}$, feedback control signal $\phi_{FB}$, and the Start signal are all at a logic low [0]. Timing controller 106 causes the feedback capacitor 117 (FIG. 1) to be charged with the residual voltage $V_{RES}$ by way of controlling the first feedback switch 121 and the second feedback switch 129 in a feedback charge mode of the feedback capacitor 117 via feedback control signal $\phi_{FB}$. In the feedback charge mode, the timing controller 106 1 causes feedback control signal $\phi_{FB}$ to be at a logic high [1], while the sample and hold signal $\phi_{SH1}$, the DAC control signal $\phi_{DAC}$, and the Start signal are all at a logic low [0]. Then, in the VTC operating mode, while the feedback control signal $\phi_{FB}$ is at the logic high [1], the timing controller 106 causes the Start signal to be at a logic high [1], which activates the first current supply 125 (FIG. 1). Timing controller 106 causes the sample and hold signal $\phi_{SH1}$, and SAR 11 causes the DAC control signal $\phi_{DAC}$, to be at the logic low [0] while the first current supply 125 is activated. The process then repeats until the second comparator 115 (FIG. 1) causes the control signal $V_C$ to stop the second ADC stage 103 (FIG. 1) from performing the time-to-digital conversion of the time domain representation of the residual voltage $V_{RES}$. In some embodiments, the various control signals are either provided or not provided, or include an instruction to cause an event to occur. As such, the above discussion regarding the timing of the logic highs and logic lows of the various control signals should be understood to correspond to the timing of whether a particular signal is being provided by the timing controller 106 and/or SAR 111, or whether a particular signal includes an instruction for an even to occur, such as turning a transistor on or off or activating a current source.

Figure 6:
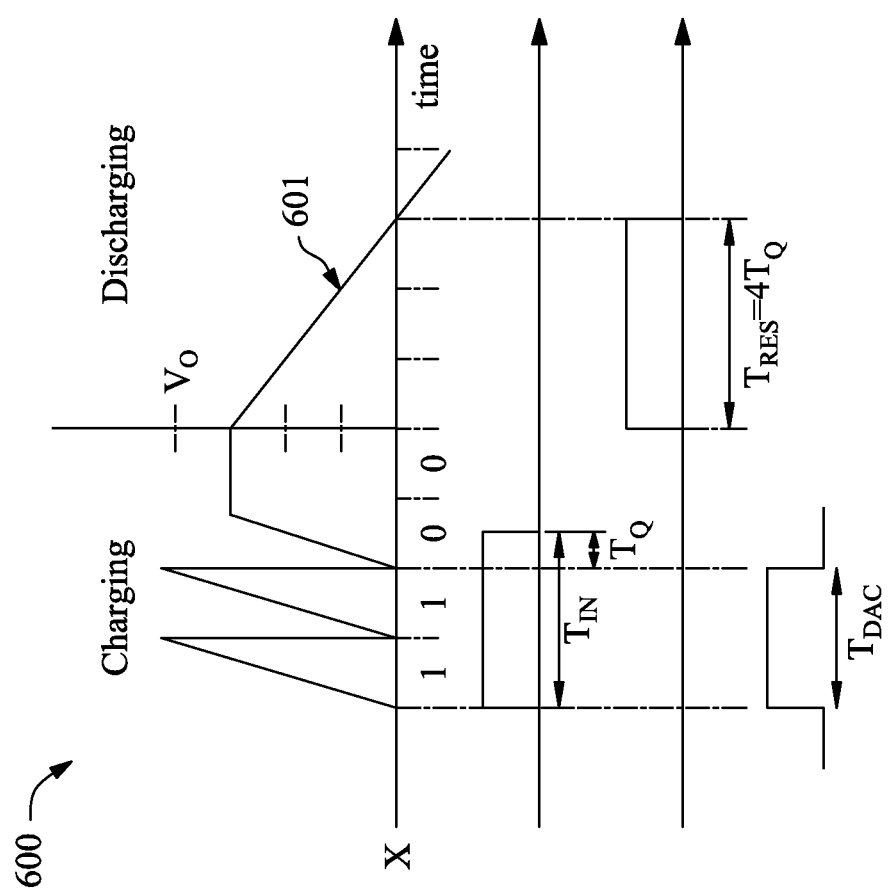
FIG. 6 is a charging and discharging plot diagram for a voltage and time domain stage, in accordance with one or more embodiments.

FIG. 6 is a charging and discharging plot diagram 600 illustrating the charge time versus discharge time of the capacitors 315a-315n (FIG. 3) of the second capacitor array 313 (FIG. 3), in accordance with one or more embodiments. In this example, capacitors 315a-315n were all initially reset such that all of the capacitors 315a-315n were coupled with the first reference signal $V_{REFP}$. Based on the signal $T_{IN}$, capacitors 315a-315n were charged to store a charge based on $V_{REFP}$ for a period of time in accordance with the signal $T_{IN}$ using the second current source 319 (FIG. 3). At the same time, the sub-TDC 303 quantized the time input signal $T_{IN}$ and generated a corresponding digital code for operating the capacitive DAC 311 (FIG. 3). Based on the generated code, capacitors 315a and 315b were coupled with the second reference signal $V_{REFM}$ (indicated in the plot diagram 600 as logical [1]), while the other capacitors 315c-315n remained coupled with the first reference signal $V_{REFP}$ (indicated in the plot diagram 600 as logical [0]). For example, the digital code generated by sub-TDC 303 was [1100]. Capacitors 315a and 315b charged to a voltage $V_0$ at which the capacitors 315a-315b reached maximum capacity. But, a portion of the residual voltage $V_{RES}$ in the time domain overflowed to capacitors 315c-315n. The overflow of the residual voltage $V_{RES}$ is a quantization error. The time to charge the capacitors 315a-315n, including the overflow residual voltage, took all of the time indicated in the signal $T_{IN}$, which was greater than the time associated with a signal $T_{DAC}$. The signal $T_{DAC}$ corresponds to an expected time for charging the capacitors 315a and 315b that were coupled with the second reference signal $V_{REFM}$. The time for charging the capacitors 315a-315n differed from the time indicated via signal $T_{DAC}$ by a time $T_Q$.

To convert the overflow voltage of the residual voltage $V_{RES}$ stored in capacitors 315c-315n from the voltage domain to the time domain as a refined residual voltage, the timing controller 106 (FIG. 1) activates the third current supply 321 (FIG. 3) by causing discharge signal $\phi_{DIS}$ (FIG. 3) to be at a logic high. Because second current supply 321 supplies a current that is less than the current supplied by the first current supply 319, the time taken to discharge the overflow of the residual voltage $V_{RES}$ is greater than the time taken to charge the capacitors 315c-315n. The time to charge and discharge the capacitors 315a-315n is compared to the X-axis, which indicates that the capacitor has a voltage of 0V stored thereon. The capacitors 315c-315n, in this example, are discharged when the plotline 601 is at the zero-crossing of the plot 600 (i.e., where the plot 600 crosses the x-axis). The overflow of the residual voltage $V_{RES}$ (i.e., the refined residual voltage) is amplified. In this example, the time domain representation of the refined residual voltage $T_{RES}$ is amplified from time $T_Q$ to a time $4T_Q$. The time domain representation of the refined residual voltage $T_{RES}$, which at this point is equal to $4T_Q$, is output by the TDC cell 129a-129n (FIG. 1) as the signal $T_O$ to a next TDC cell 129b-129n for further processing following the zero-crossing of the plot line 601.

Figure 7:
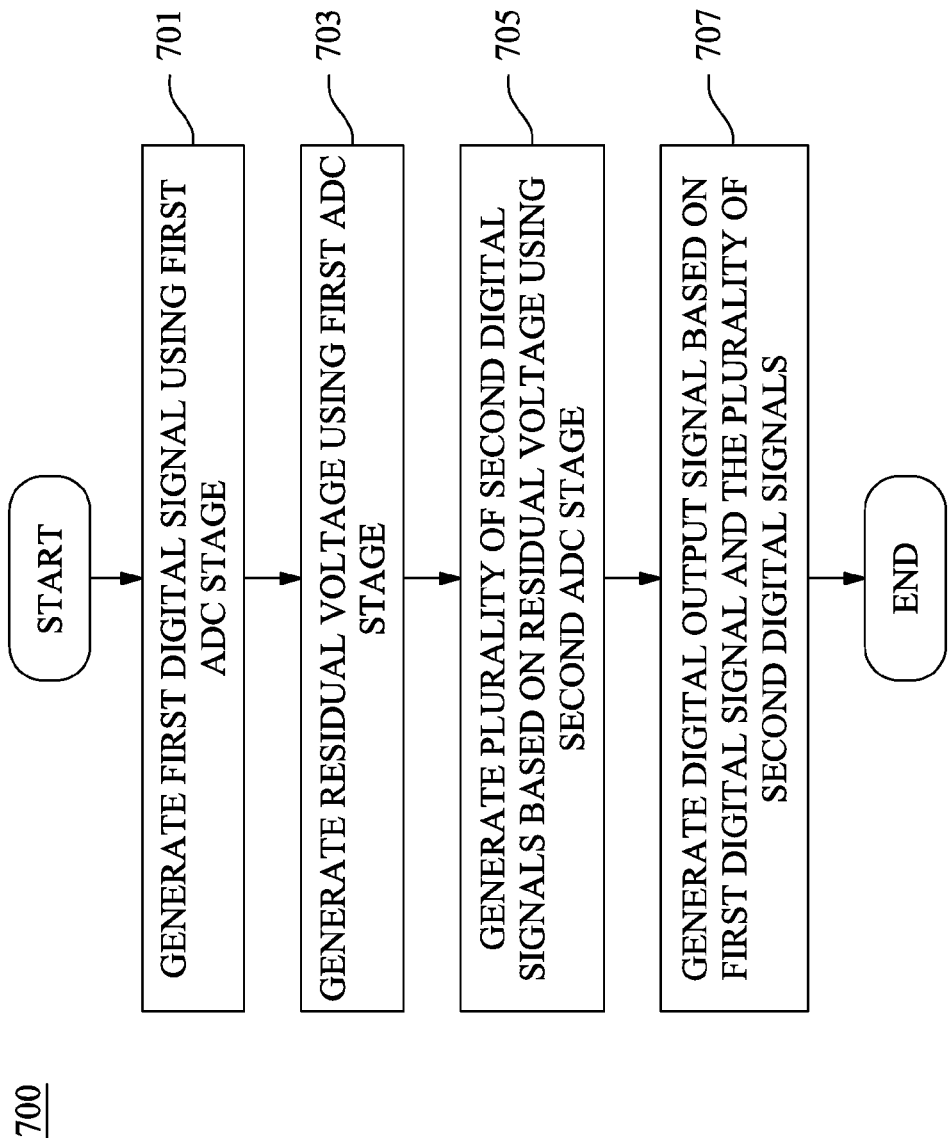
FIG. 7 is a flowchart of a method of converting an analog signal to a digital signal, in accordance with one or more embodiments

FIG. 7 is a flowchart of a method 700 of converting an analog signal to a digital signal, in accordance with one or more embodiments. In step 701, a first ADC stage of an ADC circuit such as ADC circuit 100 (FIG. 1), generates a first digital signal corresponding to a most-significant-bits (MSB) portion of the digital output signal. In step 703, the first ADC stage generates a residual voltage corresponding to a voltage value difference between the analog input signal and the first digital signal. In step 705, a second ADC stage converts the residual voltage into a plurality of second digital signals corresponding to a least-significant-bits (LSB) portion of the digital output signal. In step 707, a digital error correction unit generates the digital output signal based on the first digital signal and the second digital signals of the plurality of second digital signals.

The processes described herein for converting an analog signal to a digital signal using a first ADC stage and a second ADC stage may be performed via software in combination with hardware or firmware, hardware, firmware or a combination of software and firmware and/or hardware. For example, the processes described herein, may be advantageously implemented via a controller, a processor, Digital Signal Processing (DSP) chip, an Application Specific Integrated Circuit (ASIC), Field Programmable Gate Arrays FPGAs, etc. Such exemplary hardware for performing the described functions is detailed below.

FIG. 8 is a functional block diagram of a computer or processor-based system 800 upon which or by which an embodiment is implemented. In some embodiments, SAR 111 (FIG. 1) and/or timing controller 106 (FIG. 1) is implemented via a computer or processor-based system such as system 800.

Processor-based system 800 is programmed to convert an analog signal to a digital signal using a first ADC stage and a second ADC stage, as described herein, and includes, for example, bus 801, processor 803, and memory 805 components.

In some embodiments, the processor-based system is implemented as a single "system on a chip." Processor-based system 800, or a portion thereof, constitutes a mechanism for designing a memory circuit. In some embodiments, the processor-based system 800 includes a communication mechanism such as bus 801 for transferring information and/or instructions among the components of the processor-based system 800. Processor 803 is connected to the bus 801 to obtain instructions for execution and process information stored in, for example, the memory 805. In some embodiments, the processor 803 is also accompanied with one or more specialized components to perform certain processing functions and tasks such as one or more digital signal processors (DSP), or one or more application-specific integrated circuits (ASIC). A DSP typically is configured to process real-world signals (e.g., sound) in real time independently of the processor 803. Similarly, an ASIC is configurable to perform specialized functions not easily performed by a more general purpose processor. Other specialized components to aid in performing the functions described herein optionally include one or more field programmable gate arrays (FPGA), one or more controllers, or one or more other special-purpose computer chips.

In one or more embodiments, the processor (or multiple processors) 803 performs a set of operations on information as specified by a set of instructions stored in memory 805 related to converting an analog signal to a digital signal using a first ADC stage and a second ADC stage. The execution of the instructions causes the processor to perform specified functions.

The processor 803 and accompanying components are connected to the memory 805 via the bus 801. The memory 805 includes one or more of dynamic memory (e.g., RAM, magnetic disk, writable optical disk, etc.) and static memory (e.g., ROM, CD-ROM, etc.) for storing executable instructions that when executed perform the steps described herein convert an analog signal to a digital signal using a first ADC stage and a second ADC stage. The memory 805 also stores the data associated with or generated by the execution of the steps.

In one or more embodiments, the memory 805, such as a random access memory (RAM) or any other dynamic storage device, stores information including processor instructions for designing a memory circuit. Dynamic memory allows information stored therein to be changed. RAM allows a unit of information stored at a location called a memory address to be stored and retrieved independently of information at neighboring addresses. The memory 805 is also used by the processor 803 to store temporary values during execution of processor instructions. In various embodiments, the memory 805 is a read only memory (ROM) or any other static storage device coupled to the bus 801 for storing static information, including instructions, that is not changed. Some memory is composed of volatile storage that loses the information stored thereon when power is lost. In some embodiments, the memory 805 is a non-volatile (persistent) storage device, such as a magnetic disk, optical disk or flash card, for storing information, including instructions, that persists even when power supplied to the memory 805 is turned off.

The term "computer-readable medium" as used herein refers to any medium that participates in providing information to processor 803, including instructions for execution. Such a medium takes many forms, including, but not limited to computer-readable storage medium (e.g., non-volatile media, volatile media). Non-volatile media includes, for example, optical or magnetic disks. Volatile media include, for example, dynamic memory. Common forms of computer-readable media include, for example, a floppy disk, a flexible disk, a hard disk, a magnetic tape, another magnetic medium, a CD-ROM, CDRW, DVD, another optical medium, punch cards, paper tape, optical mark sheets, another physical medium with patterns of holes or other optically recognizable indicia, a RAM, a PROM, an EPROM, a FLASH-EPROM, an EEPROM, a flash memory, another memory chip or cartridge, or another medium from which a computer can read. The term computer-readable storage medium is used herein to refer to a computer-readable medium.

An aspect of this description relates to an analog-to-digital converter (ADC) that comprises a first ADC stage and a second ADC stage. The first ADC stage comprises a successive approximation register (SAR). The first ADC stage is configured to convert an analog input signal into a first digital signal corresponding to a most-significant-bits (MSB) portion of a digital output signal, and to generate a residual voltage corresponding to a voltage value difference between the analog input signal and the first digital signal. The second ADC stage is coupled with the first ADC stage. The second ADC stage comprises a plurality of time-to-digital converter (TDC) cells coupled in series. The second ADC stage is configured to convert the residual voltage into a plurality of second digital signals. The second digital signals of the plurality of second digital signals collectively correspond to a least-significant-bits (LSB) portion of the digital output signal. Each TDC cell of the plurality of TDC cells is configured to generate one second digital signal of the plurality of second digital signals.

Another aspect related to this description relates to a method of converting an analog signal to a digital signal. The method comprises generating a first digital signal corresponding to a most-significant-bits (MSB) portion of the digital output signal using a first analog to digital converter (ADC) stage. The first ADC stage comprises a successive approximation register (SAR). The method also comprises generating a residual voltage corresponding to a voltage value difference between the analog input signal and the first digital signal. The method further comprises converting the residual voltage into a plurality of second digital signals corresponding to a least-significant-bits (LSB) portion of the digital output signal using a second ADC stage of the ADC coupled with the first ADC stage. The second ADC stage comprises a plurality of time-to-digital converter (TDC) cells coupled in series. The TDC cells of the plurality of TDC cells each generate one second digital signal of the plurality of second digital signals.

A further aspect of this description relates to an analog-to-digital converter (ADC) comprising a first ADC stage and a second ADC stage. The first ADC stage is configured to convert a received analog input signal into a first digital signal corresponding to a most-significant-bits (MSB) portion of a digital output signal. The first ADC stage is also configured to generate a residual voltage corresponding to a difference between a voltage value of the analog input signal and the first digital signal. The first ADC stage comprises a successive approximation register (SAR). The first ADC stage also comprises a capacitor array comprising a plurality of capacitors. The capacitors of the capacitor array comprise a first side coupled with a first node. The capacitors of the capacitor array also comprise a second side configured to be selectively coupled with one of the analog input signal, a first reference signal or a second reference signal. The first ADC stage further comprises a first comparator comprising a first input coupled with the first node and a second input coupled with one of the first reference signal, the second reference signal, or a third reference signal. The first comparator is configured to generate the residual voltage. The first ADC stage additionally comprises a second comparator comprising a third input coupled with the first comparator and a fourth input coupled with a ground voltage. The second comparator is configured to compare the residual voltage with the ground voltage and to output a control signal to the second ADC based on the comparison.

The second ADC stage is coupled with the first ADC stage. The second ADC stage comprises a plurality of time-to-digital converter (TDC) cells coupled in series. The second ADC stage is configured to convert the residual voltage into a plurality of second digital signals generated by the TDC cells of the plurality of TDC cells. The second digital signals of the plurality of second digital signals correspond to a least-significant-bits (LSB) portion of the digital output signal.

The ADC further comprises a digital error correction unit configured to generate the digital output signal based on the first digital signal and the plurality of second digital signals. The SAR is configured to control the selective coupling of the second sides of the capacitors of the capacitor array with the analog input signal, the first reference signal or the second reference signal based on the residual voltage output by the first comparator.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An analog-to-digital converter (ADC) comprising:
   a first ADC stage, the first ADC stage comprises a successive approximation register (SAR), the first ADC stage is configured to convert an analog input signal into a first digital signal corresponding to a most-significant-bits (MSB) portion of a digital output signal, and to generate a residual voltage corresponding to a voltage value difference between the analog input signal and the first digital signal; and
   a second ADC stage coupled with the first ADC stage, the second ADC stage comprises a plurality of time-to-digital converter (TDC) cells coupled in series, the second ADC stage is configured to convert the residual voltage into a plurality of second digital signals,
   wherein the second digital signals of the plurality of second digital signals collectively correspond to a least-significant-bits (LSB) portion of the digital output signal, and each TDC cell of the plurality of TDC cells is configured to generate a second digital signal of the plurality of second digital signals.

2. The analog-to-digital converter of claim 1, wherein a first TDC cell of the plurality of TDC cells is configured to generate one second digital signal of the plurality of second digital signals based on the residual voltage, and a second TDC cell of the plurality of TDC cells is configured to generate another second digital signal of the plurality of second digital signals based on the one second digital signal of the plurality of second digital signals generated by the first TDC cell of the plurality of TDC cells.

3. The analog-to-digital converter of claim 1, further comprising:
a digital error correction unit configured to generate the digital output signal based on the first digital signal and the second digital signals of the plurality of second digital signals.

4. The analog-to-digital converter of claim 1, wherein the first ADC stage further comprises:
a first capacitor array comprising a plurality of capacitors, the capacitors of the first capacitor array comprise a first side coupled with a first node, and a second side configured to be selectively coupled with one of the analog input signal, a first reference signal or a second reference signal;
a first comparator comprising a first input coupled with the first node and a second input coupled with one of the first reference signal, the second reference signal, or a third reference signal, the first comparator is configured to generate the residual voltage; and
a second comparator comprising a third input coupled with the first comparator and a fourth input coupled with the second reference signal, the second comparator is configured to compare the residual voltage with the second reference signal and to output a control signal to the second ADC stage.

5. The analog-to-digital converter of claim 4, wherein the TDC cells of the plurality of TDC cells are configured to stop converting the residual voltage into the plurality of second digital signals based on the control signal.

6. The analog-to-digital converter of claim 5, further comprising:
a feedback capacitor having a first side and a second side;
a feedback path coupled with the first node and a second node between the first comparator and the second comparator;
a first feedback switch configured to selectively couple the first side of the feedback capacitor with the first node; and
a second feedback switch configured to selectively couple the second side of the feedback capacitor with the second node,
wherein the feedback capacitor is configured to store the residual voltage.

7. The analog-to-digital converter of claim 6, further comprising:
a first current source configured to be selectively coupled with the first node,
wherein the first current source, if coupled with the first node, is configured to amplify the residual voltage, cause the residual voltage to be drained from the feedback capacitor at a constant rate, and enable a conversion of the residual voltage from a voltage domain representation to a time domain representation based on an amount of time the feedback capacitor takes to discharge.

8. The analog-to-digital converter of claim 7, wherein the TDC cells of the plurality of TDC cells each comprise:
a sub-TDC comprising one or more delay elements, the sub-TDC is configured to receive the residual voltage in the time domain from the first ADC stage or a refined residual voltage in the time domain based on one second digital signal of the plurality of second digital signals output from a previous TDC cell;
a third comparator having a fifth input and a sixth input, the sixth input is coupled with the second reference signal;
a second capacitor array comprising a plurality of capacitors, each capacitor of the plurality of capacitors of the second capacitor array comprises a first side coupled with the fifth input of the third comparator, and a second side configured to be selectively coupled with the first reference signal or the second reference signal;
a second current supply configured to be selectively coupled with the first side of the capacitors of the second capacitor array in a charge mode; and
a third current supply configured to be selectively coupled with the first side of the capacitors of the second capacitor array in a discharge mode,
wherein the second current supply is greater than the third current supply, and a charge time of the capacitors of the second capacitor array differs from a discharge time of the capacitors of the second capacitor array based on a difference between the second current supply and the third current supply.

9. The analog-to-digital converter of claim 8, wherein the second current supply, in the charge mode, is configured to charge the capacitors of the second capacitor array based on the time domain representation of the residual voltage or the refined residual voltage in the time domain, and the third current supply, in the discharge mode, is configured to cause the time domain representation of the residual voltage or the refined residual voltage in the time domain output by a previous TDC cell to be amplified.

10. The analog-to-digital converter of claim 8, wherein the sub-TDC is configured to generate a code based on the residual voltage in the time domain or the refined residual voltage in the time domain output from the previous TDC cell, and the second sides of the capacitors of the second capacitor array are configured to be selectively coupled with the first reference signal or the second reference signal based on the generated code.

11. The analog-to-digital converter of claim 4, wherein the SAR is configured to control the selective coupling of the second sides of the capacitors of the first capacitor array with the analog input signal, the first reference signal or the second reference signal based on the residual voltage generated by the first comparator.

12. A method of converting an analog input signal to a digital output signal, the method comprising:
generating a first digital signal corresponding to a most-significant-bits (MSB) portion of the digital output signal using a first analog to digital converter (ADC) stage, the first ADC stage comprises a successive approximation register (SAR);
generating a residual voltage corresponding to a voltage value difference between the analog input signal and the first digital signal; and
converting the residual voltage into a plurality of second digital signals corresponding to a least-significant-bits (LSB) portion of the digital output signal using a second ADC stage coupled with the first ADC stage, the second ADC stage comprises a plurality of time-to-digital converter (TDC) cells coupled in series, wherein the TDC cells of the plurality of TDC cells each generate a second digital signal of the plurality of second digital signals.

13. The method of claim 12, further comprising:
generating one second digital signal of the plurality of second digital signals based on the residual voltage using a first TDC cell of the plurality of TDC cells; and
generating another second digital signal of the plurality of second digital signals based on the one second digital signal of the plurality of second digital signals generated by the first TDC cell of the plurality of TDC cells using a second TDC cell of the plurality of TDC cells.

14. The method of claim 12, further comprising:
generating the digital output signal based on the second digital signals of the plurality of second digital signals using a digital error correction unit.

15. The method of claim 12, further comprising:
selectively coupling one of the analog input signal, a first reference signal or a second reference signal with one or more capacitors of a first capacitor array, the capacitors of the first capacitor array comprising a first side coupled with a first node;
generating the residual voltage using a first comparator comprising a first input coupled with the first node and a second input coupled with one of the first reference signal, the second reference signal, or a third reference signal;
comparing the residual voltage with the second reference signal using a second comparator, the second comparator coupled to the second ADC stage, the second comparator comprising a third input coupled with the first comparator and a fourth input coupled with the second reference signal; and
generating a control signal using the second comparator based on the comparison.

16. The method of claim 15, further comprising:
selectively coupling a feedback capacitor with a feedback path to store the residual voltage in the feedback capacitor.

17. The method of claim 16, further comprising:
amplifying the residual voltage by selectively coupling a first current source with the first node;
draining the residual voltage at a constant rate; and
converting the residual voltage from a voltage domain representation to a time domain representation based on an amount of time the feedback capacitor takes to discharge.

18. The method of claim 17, further comprising:
receiving, by a sub-TDC of one TDC cell of the plurality of TDC cells, the residual voltage in the time domain from the first ADC stage or a refined residual voltage in the time domain based on one second digital signal of the plurality of second digital signals output from a previous TDC cell;
selectively coupling one or more capacitors of a second capacitor array with the first reference signal or the second reference signal;
selectively coupling a second current supply with the capacitors of the second capacitor array in a charge mode; and
selectively coupling a third current supply with the capacitors of the second capacitor array in a discharge mode,
wherein the second current supply is greater than the third current supply, and the capacitors of the second capacitor array are charged by the second current source based on the time domain representation of the residual voltage or the refined residual voltage in the time domain.

19. The method of claim 18, further comprising:
generating a code based on the control signal or the refined residual voltage in the time domain output from the previous TDC cell using the sub-TDC,
wherein the capacitors of the second capacitor array are selectively coupled with the first reference signal or the second reference signal based on the generated code.

20. An analog-to-digital converter (ADC) comprising:
a first ADC stage configured to convert a received analog input signal into a first digital signal corresponding to a most-significant-bits (MSB) portion of a digital output signal, and to generate a residual voltage corresponding to a difference between a voltage value of the analog input signal and the first digital signal, the first ADC stage comprising:
 a successive approximation register (SAR);
 a capacitor array comprising a plurality of capacitors, the capacitors of the capacitor array comprising a first side coupled with a first node, and a second side configured to be selectively coupled with one of the analog input signal, a first reference signal or a second reference signal;
 a first comparator comprising a first input coupled with the first node and a second input coupled with one of the first reference signal, the second reference signal, or a third reference signal, the first comparator is configured to generate the residual voltage; and
 a second comparator comprising a third input coupled with the first comparator and a fourth input coupled with the second reference signal, the second comparator is configured to compare the residual voltage with the second reference signal and to output a control signal based on the comparison, the control signal comprising the residual voltage;
a second ADC stage coupled with the first ADC stage, the second ADC stage comprises a plurality of time-to-digital converter (TDC) cells coupled in series, the second ADC stage is configured to convert the residual voltage into a plurality of second digital signals generated by the TDC cells of the plurality of TDC cells, the second digital signals of the plurality of second digital signals correspond to a least-significant-bits (LSB) portion of the digital output signal; and
a digital error correction unit configured to generate the digital output signal based on the first digital signal and the second digital signals of the plurality of second digital signals,
wherein the SAR is configured to control the selective coupling of the second sides of the capacitors of the capacitor array with the analog input signal, the first reference signal or the second reference signal based on the residual voltage generated by the first comparator.

\* \* \* \* \*